United States Patent [19]

Danzeisen

[11] Patent Number: 5,132,630
[45] Date of Patent: Jul. 21, 1992

[54] HETERODYNE ANALYZER FOR MEASURING FREQUENCY CHARACTERISTICS OF QUADRIPOLES

[75] Inventor: Klaus Danzeisen, Gräfelfing, Fed. Rep. of Germany

[73] Assignee: Rohde & Schwarz GmbH & Co. KG, Fed. Rep. of Germany

[21] Appl. No.: 675,270

[22] Filed: Mar. 26, 1991

[30] Foreign Application Priority Data

Mar. 27, 1990 [DE] Fed. Rep. of Germany ....... 4009750

[51] Int. Cl.[5] ........................................... G01R 23/16
[52] U.S. Cl. ............................. 324/619; 324/77 CS; 324/77 C; 324/603; 455/87
[58] Field of Search ............... 455/86, 87; 324/619, 324/77 C, 77 CS, 603, 616

[56] References Cited

U.S. PATENT DOCUMENTS 2,931,900  4/1960  Goodman ........................... 324/619
3,643,126  2/1972  Hay .................................... 324/77 C
4,373,205  2/1983  Mizota ................................ 455/86
4,451,782  5/1984  Ashida ............................... 324/77 C

FOREIGN PATENT DOCUMENTS 2151981  4/1973  Fed. Rep. of Germany .
2542744  5/1975  Fed. Rep. of Germany .
3634528  4/1988  Fed. Rep. of Germany .

OTHER PUBLICATIONS

Wandel & Goltermann, "Electronic Measurement Techniques," Edition 1989, pp. 163–168.

Primary Examiner—Gerard R. Strecker
Assistant Examiner—Jose M. Solis
Attorney, Agent, or Firm—Hill, Van Santen, Steadman & Simpson

[57] ABSTRACT

In an analyzer for measuring the frequency characteristics of quadripoles, comprising an indicator circuit in which the output of the quadripole to be measured is converted to an intermediate frequency by a mixer and a frequency-variable local oscillator, and comprising a variable-frequency second local oscillator whose output frequency is mixed with another mixer and with the frequency of the local oscillator to be converted to an input signal for the quadripole to be measured, the output frequency of the variable frequency second local oscillator is adjusted to be offset by at least ±5 MHz relative to the intermediate frequency value of the indicator circuit.

4 Claims, 1 Drawing Sheet

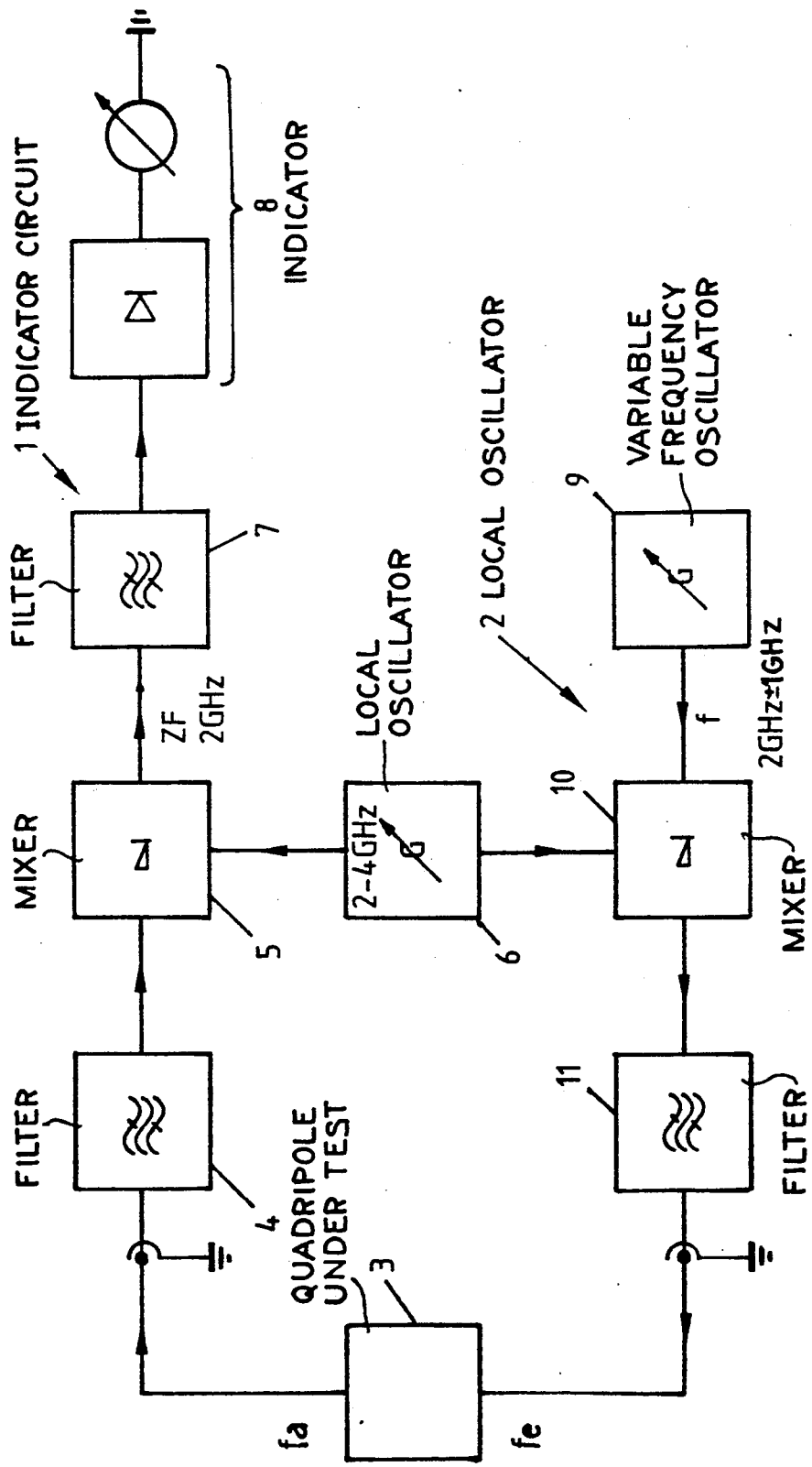

HETERODYNE ANALYZER FOR MEASURING FREQUENCY CHARACTERISTICS OF QUADRIPOLES

BACKGROUND OF THE INVENTION

1. Field of the Invention

The present invention relates to a heterodyne-type for measuring the frequency characteristics, such as attenuation, amplification and phase, of quadripoles.

2. Description of the Prior Art

Heterodyne spectrum or network analyzers of the type generally set forth above for measuring the frequency characteristics of quadripoles, for example for measuring the quadripole transfer function (attenuation, amplification or phase) are known in the art from the German published application 24 52 744. The frequency of the locked oscillator thereof correspond exactly to the intermediate frequency to which an unknown signal in an indicator branch is converted. It is also known in the art to provide this oscillator as a frequency-variable oscillator within very narrow limits of a few kilohertz, which is determined by the accuracy of the oscillator, so that in the case of a very narrow intermediate frequency bandwidth, the unknown signal may be set precisely at the middle of the band.

With such a known analyzer, it is not possible to measure-frequency-converting quadripoles in which the input and output frequencies are different.

SUMMARY OF THE INVENTION

It is therefore the object of the present invention to provide an improved analyzer of the type set forth above such that is also suited for measuring quadripoles for almost any desired frequency change.

Based on an analyzer for measuring the frequency characteristics of quadripoles, the above object is achieved, according to the present invention, in which the analyzer is characterized as comprising an indicator circuit in which an output of the quadripole to be measured is converted to an intermediate frequency with a mixer and a frequency-variable local oscillator, and in which a second local oscillator is provided whose output frequency is mixed in another mixer with the frequency of the other local oscillator to be converted to an input signal for the quadripole to be measured, the output frequency of the second local oscillator being adjusted to be offset by at least $+5$ MHz relative to the intermediate frequency value of the indicator circuit.

According to a particular feature of the invention, the analyzer is particularly characterized in that the second local oscillator is a frequency synthesizer.

According to another feature of the invention, the analyzer may be characterized particularly in that an input signal for the quadripole to be measured has a constant level in the variable-frequency range of the locking oscillator.

According to another feature of the invention, the analyzer may be particularly characterized in that the indicator circuit comprises circuit means for frequency response compensation.

Due to the configuration of the second local oscillator which is variable in frequency within a relatively broad frequency band, it is possible to perform corresponding measurements with such an analyzer also in quadripoles which possess inherent frequency translation, for instance on quadripoles in which the input frequency is converted to an intermediate frequency by way of internal heterodyning, the frequency variation of the second local oscillator in respect of the intermediate frequency value in the positive direction and in the negative direction should occur across the width which corresponds at least to the variable-frequency width of the local oscillator; but since substantially smaller frequency translations of only a few kHz or MHz occur most of the quadripoles to be analyzed, it is sufficient when the second local oscillator can be rendered variable in frequency relative to its intermediate frequency value by at least $+$MHz so that most of the commonly-used quadripoles having intermediate frequency translation can be measured. In a practical embodiment with a local oscillator which is variable in frequency within a frequency range of from 2–GHz it has proven sufficient when this second local oscillator is rendered variable in frequency by $+1$ GHz about the intermediate frequency of 2 GHz, so that frequency changes of 1 GHz may still be compensated. Since the second local oscillator is adjustable to be offset in either direction relative to the intermediate frequency value, it is also possible to measure quadripoles in which the input frequency is changed to the same or the inverted position. It is also possible with the analyzer constructed in accordance with the present invention to determine, by corresponding frequency variation, the frequency sensitivity of the output amplitude in quadripoles which perform translation to a fixed output frequency. The second local oscillator should have a high frequency stability so as to enable measurements with a very small intermediate frequency bandwidth in the indicator circuit. Preferably, the second local oscillator is therefore configured, as known per se, as a frequency synthesizer. Moreover, the output amplitude of the system should be constant independently of the frequency, which may be achieved by proper level control. The indicator circuit also should have a very small frequency response which may be achieved, for example, as disclosed in the German patent 36 34 528.

BRIEF DESCRIPTION OF THE DRAWING

Other objects, features and advantages of the invention, its organization, construction and operation will be best understood from the following detailed description, taken in conjunction with the accompanying drawing on which there is a single figure which is a block diagram of a heterodyne analyzer constructed in accordance with the present invention.

DESCRIPTION OF THE PREFERRED EMBODIMENTS

Referring to the drawing, a heterodyne analyzer is illustrated in block diagram form as comprising an indicator circuit 1 and an associated local oscillator 6 and including a second local oscillator 2. An output signal $f_a$ from a quadripole 3 to be measured is supplied to the indicator circuit 1 through a filter 4 to a mixer 5 where frequency translation (conversion) is effected by way of the frequency-variable local oscillator 6 to an intermediate frequency ZF which, after passing through a filter 7, is indicated with an indicator circuit 8. The indicator circuit 8 may comprise a rectifier followed by a meter or the like. The input of the quadripole 3 to be measured is supplied with the frequency $f_e$ which is generated in the second local oscillator circuit 2 by mixing, in a mixer 10, the output frequency of a frequency-variable second local oscillator 9 with the output frequency of the local oscillator 6. The frequency component which corresponds to the input frequency of the indicator circuit, i.e., the output frequency $f_a$ of the quadripole 3 is filtered out in a filter 11. The output frequency f of the locked oscillator 9 is set in accordance with the frequency translation in the measured quadripole 3, and when no frequency translation occurs in the quadripole 3 ($f_a = f_e$), the output frequency f of the second local oscillator 9 is set to the intermediate frequency ZF of the indicator circuit 1. But when a quadripole is analyzed in which a frequency translation by f takes place ($f_a = f_e \pm \Delta f$), the frequency of the second local oscillator 9 is varied correspondingly by the mentioned frequency offset of $\pm \Delta f$. In this manner, it is therefore possible to analyze any quadripole in which any desired frequency transfer takes place at a fixed oscillator frequency.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An analyzer for measuring the frequency characteristics of quadripoles, comprising:

a variable-frequency first local oscillator;

an indicator circuit to be connected to the output of a quadripole to be tested, the quadripole including an input, said indicator circuit including connecting means for connection to the quadripole and to said first local oscillator for converting the output frequency of the quadripole to an intermediate frequency;

mixer means in said connecting means and connected to said variable-frequency first local oscillator;

a variable-frequency second local oscillator connected to said mixer means and via said mixer means for connection to the quadripole for producing an output frequency which is converted to an input signal for the quadripole and adapted to be offset by at least $\pm 5$ MHz relative to the intermediate frequency of said indicator circuit.

2. The analyzer of claim 1 wherein:

said second local oscillator comprises a frequency synthesizer.

3. The analyzer of claim 1 wherein:

said second oscillator comprises means for providing the input signal for the quadripole at a constant level in the variable-frequency range of said second local oscillator.

4. The analyzer of claim 1 wherein:

said indicator circuit comprises means for frequency response compensation.

* * * * *